United States Patent
Kawada

(10) Patent No.: US 12,349,402 B2
(45) Date of Patent: Jul. 1, 2025

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yasuyuki Kawada, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 500 days.

(21) Appl. No.: 17/855,063

(22) Filed: Jun. 30, 2022

(65) Prior Publication Data
US 2023/0055755 A1    Feb. 23, 2023

(30) Foreign Application Priority Data
Aug. 17, 2021    (JP) .................... 2021-132897

(51) Int. Cl.
*H10D 12/00* (2025.01)
*H01L 21/04* (2006.01)
(Continued)

(52) U.S. Cl.
CPC ....... *H10D 30/668* (2025.01); *H01L 21/0445* (2013.01); *H10D 12/481* (2025.01); *H10D 62/8325* (2025.01); *H10D 64/513* (2025.01)

(58) Field of Classification Search
CPC ............. H01L 29/7397; H01L 29/1608; H01L 29/4236; H01L 29/66333; H01L 29/1095;
(Continued)

(56) References Cited

U.S. PATENT DOCUMENTS

| | | | |
|---|---|---|---|
| 2014/0061861 A1* | 3/2014 | Moustakas | H01L 21/3065 438/697 |
| 2015/0021623 A1* | 1/2015 | Lichtenwalner | H10D 62/8325 257/77 |

(Continued)

FOREIGN PATENT DOCUMENTS

| | | | |
|---|---|---|---|
| JP | 2010222232 A | * | 10/2010 |
| JP | 6729824 B1 | | 7/2020 |
| WO | WO-2022186284 A1 | * | 9/2022 |

OTHER PUBLICATIONS

Narvaez et al., Cathodoluminescence Microscopy of nanostructures on glass substrates, Optics Express, vol. 21, Issue 24, pp. 29968-29978 (2013) (Year: 2013).*

(Continued)

*Primary Examiner* — Bryan R Junge
*Assistant Examiner* — Gary Abel
(74) *Attorney, Agent, or Firm* — Rabin & Berdo, P.C.

(57) ABSTRACT

After trench etching but before formation of a gate insulating film, a 15-minute to 60-minute heat treatment under a mixed gas atmosphere containing nitric oxide gas and nitrogen gas at a temperature from 1200 degrees C. to 1350 degrees C. and a 30-minute to 75-minute heat treatment under a nitrogen gas atmosphere held at the temperature of the 15-minute to 60-minute heat treatment are successively performed, oxidizing etching damage of inner walls of trenches. The total treatment time of the heat treatments includes a total time of at least 90 minutes when the temperature is a predetermined maximum temperature. The oxide layer of the trench inner walls is removed, exposing a clean face. Emission intensity of band edge emission for SiC obtained by CL analysis of surface areas of the inner walls of the trenches is at least equal to the emission intensity of (Continued)

the band edge emission for SiC obtained by the CL analysis of a surface free of dry etching.

10 Claims, 11 Drawing Sheets

(51) Int. Cl.
*H10D 12/01* (2025.01)
*H10D 30/66* (2025.01)
*H10D 62/832* (2025.01)
*H10D 64/27* (2025.01)

(58) Field of Classification Search
CPC ........... H01L 29/0623; H01L 29/66068; H01L 29/7813; H01L 21/0445; H10D 12/481; H10D 12/032; H10D 62/8325; H10D 64/513; H10D 30/668; H10D 12/031; H10D 62/393; H10D 62/107; H10D 48/031; H10D 84/035; C01B 32/956–984
See application file for complete search history.

(56) References Cited

U.S. PATENT DOCUMENTS

2021/0234005 A1 7/2021 Kawada
2022/0005925 A1* 1/2022 Shimizu ............... H10D 30/668

OTHER PUBLICATIONS

Hsu et al., 3C-SiC-induced peak emission intensity in photoluminescence spectrum of SiC/SiO2 core-shell nanowires using first-principles calculations, AIP Advances, vol. 11, Issue 6, Jun. 2021 (Year: 2021).*
Surface-state origin for the blueshifted emission in anodically etched porous silicon carbide (Year: 2001).*
Influence of nitrogen doping on the properties of 4HaSiC single crystals grown by physical vapor transport (Year: 2003).*

* cited by examiner

FIG. 4

| | BAND EDGE EMISSION INTENSITY COMPARISON |
|---|---|
| FIRST COMPARISON EXAMPLE (NO DRY ETCHING) | 1.0 |
| SECOND COMPARISON EXAMPLE (DRY ETCHING ONLY) | ABOUT 0.2 |
| CONVENTIONAL EXMPLE (DRY ETCHING + SACRIFICIAL OXIDATION + REMOVAL OF OXIDIZED LAYER) | ABOUT 0.4 |
| EXAMPLE (DRY ETCHING + SUCCESSIVE NO/$N_2$ AND $N_2$ HEAT TREATMENTS + REMOVAL OF OXIDIZED LAYER) | ABOUT 1.35 |

FIG.10

|  | LONG-WAVELENGTH-SIDE BROAD-EMISSION RATIO ||
|  | ACCELERATION VOLTAGE: 2kV | ACCELERATION VOLTAGE: 5kV |
| --- | --- | --- |
| FIRST COMPARISON EXAMPLE | ABOUT 40 | ABOUT 9.0 |
| SECOND COMPARISON EXAMPLE | ABOUT 46 | ABOUT 11.5 |
| CONVENTIONAL EXMPLE | ABOUT 35 | ABOUT 9.1 |
| EXAMPLE | ABOUT 17 | ABOUT 7.5 |

FIG.11

|  | CHANNEL MOBILITY (cm$^2$/Vs) | GATE THRESHOLD VOLTAGE (V) |
| --- | --- | --- |
| SECOND COMPARISON EXAMPLE | 31.9 | 3.5 |
| CONVENTIONAL EXMPLE | 36.3 | 4.0 |
| EXAMPLE | 44.4 | 3.9 |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-132897, filed on Aug. 17, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a trench-gate-type metal oxide semiconductor field effect transistor (SiC-MOSFET) that uses silicon carbide (SiC) as a semiconductor material and has insulated gates with a three-layer structure including a gate, an oxide film, and a semiconductor, dry etching is performed as etching (hereinafter, trench etching) for forming trenches that configure a trench gate structure. Then, after surfaces of inner walls (sidewalls and bottoms) of the trenches are planarized and cleaned by removing etching damage (damage), a gate insulating film is formed along the inner walls of the trenches and a heat treatment (annealing) for baking the gate insulating film is performed.

In particular, in the trench etching, plasma etching equipment is used that advances the etching by externally discharging and removing volatile reaction-products generated when, for example, a source gas containing, as a base, a fluorine-based gas such as sulfur hexafluoride ($SF_6$) gas or methane tetrafluoride ($CF_4$) gas and oxygen ($O_2$) gas is converted into a high-density plasma and chemically reacts with a semiconductor (semiconductor substrate). Due to ion collision and adhesion of fluorine (F), etc., surface roughness occurs along the inner walls of the trenches formed by the plasma etching. Therefore, after the trench etching, unevenness and adhered particles are removed from the surfaces of the inner walls of the trenches by a high-temperature heat treatment (hydrogen annealing) performed under a hydrogen gas (100% $H_2$ gas) atmosphere, whereby the surfaces of the inner walls of the trenches are planarized.

Further, opening corner portions and bottom corner portions of the trenches are suitably rounded by a surface diffusion effect of silicon (Si) atoms by the hydrogen annealing. The opening corner portions of the trenches are borders between a front surface of the semiconductor substrate and sidewalls of the trenches while the bottom corner portions of the trenches are borders between the sidewalls and the bottoms of the trenches. Moreover, by a heat treatment for a certain amount of time under an oxygen gas atmosphere, the surfaces of the inner walls of the trenches are oxidized (subject to sacrificial oxidation) and this oxidized portion (hereinafter, oxide layer) is removed, whereby the surfaces of inner walls of the trenches are cleaned and thereafter, along the inner walls of the trenches, the gate insulating film is formed. Subsequently, the heat treatment for baking the gate insulating film is performed and thereafter, a polysilicon (poly-Si) layer constituting gate electrodes is embedded in the trenches, whereby the trench gate structure is formed.

As a method of forming the gate insulating film, a method has been proposed in which an oxygen-ion implanted layer is formed in surface regions of the sidewalls of the trenches by obliquely implanting oxygen ions through an oxide film mask constituting a screen oxide film and after the oxide film mask is removed, a silicon dioxide ($SiO_2$) film (hereinafter, HTO film) constituting the gate insulating film is deposited by high-temperature oxidation (HTO) (for example, refer to Japanese Patent No. 6729824). In Japanese Patent No. 6729824, excess carbon occurring in early stages of deposition of the HTO film and excess carbon in gate insulating film reacts with oxygen in the oxygen-ion implanted layer, forms a carbon oxide, and is desorbed, whereby the occurrence of excess carbon is suppressed compared to an instance in which the gate insulating film is formed by thermal oxidation.

SUMMARY OF THE INVENTION

According to an embodiment of the invention, a silicon carbide semiconductor device has an insulated gate with a three-layered structure including a gate, an oxide film, and a semiconductor; the silicon carbide semiconductor device includes: a semiconductor substrate containing silicon carbide and constituting the semiconductor, the semiconductor substrate having a main surface; and a trench gate structure including the gate, the oxide film, and the semiconductor. The trench gate structure further includes a trench having a predetermined depth below the main surface of the semiconductor substrate, in a depth direction; a gate insulating film provided along an inner wall of the trench, the gate insulating film being in contact with the semiconductor substrate at the inner wall of the trench and constituting the oxide film; and a gate electrode provided on the gate insulating film in the trench, the gate electrode constituting the gate. The trench gate structure has a channel formed along a sidewall of the inner wall of the trench in the semiconductor substrate when the device is on. A first emission intensity of a first band edge emission of the silicon carbide in a first surface area of the inner wall of the trench is at least equal to a second emission intensity of a second band edge emission of the silicon carbide in a second surface area of a surface of the semiconductor substrate, the first emission intensity and the second emission intensity being obtained by a cathodoluminescence technique, the second surface area being free of dry etching.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a table of band edge emission intensity ratios for SiC obtained by CL analysis of a first comparison example, a second comparison example, a conventional example, and an example.

FIG. 10 is a table showing an emission intensity ratio of long-wavelength-side broad emission for SiC in the example.

FIG. 11 is a table showing electrical characteristics of the example.

DETAILED DESCRIPTION OF THE INVENTION

Figure 1:
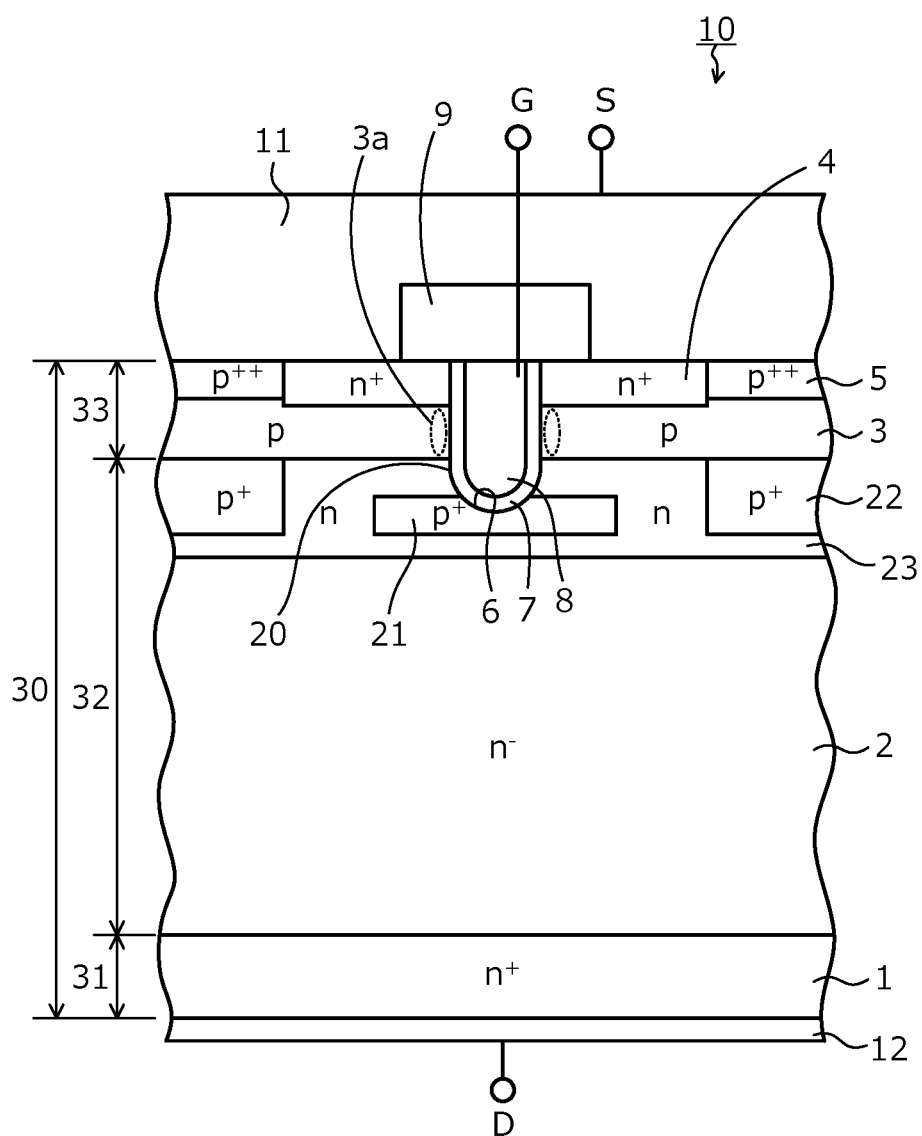
FIG. 1 is a cross-sectional view depicting a structure of a silicon carbide semiconductor device according to an embodiment.

First, problems associated with the conventional techniques are discussed. In the plasma etching, ions in the plasma accelerate, collide with the SiC surface, and chemically react with the SiC, whereby etching of the SiC advances. Due to the collisions of the ions, atomic vacancies, lattice defects (interstitial atoms), dangling bonds (dangling bonds), and impurity defects (impurities other than dopants) occur in the SiC crystal (semiconductor substrate). Further, in the SiC crystal, excess current flows due to conduction currents caused by ion currents and electrons in the plasma, and the above defects occur due to atomic bonds of the SiC crystal being broken by high-energy photons generated by the ion collisions.

Due to these defects caused by the plasma etching, significant etching damage occurs at the SiC surface. In a conventional silicon carbide semiconductor device (SiC-MOSFET), p-type base regions have portions that are along the sidewalls of the trenches and in the portions, channels (n-type inversion layer) are formed; thus, when etching damage occurs at the surfaces (SiC surface) of the inner walls of the trenches due to the plasma etching used for the trench etching, decreases in electrical characteristics (reduced channel mobility, gate threshold voltage variation, etc.) may occur. Therefore, as described above, in the method of manufacturing the conventional silicon carbide semiconductor device, the etching damage of the surfaces of the inner walls of the trenches is removed by hydrogen annealing.

Further, source sagging that occurs on the sidewalls of the trenches due to the surface diffusion effect of the silicon atoms in the hydrogen annealing has to be removed. Source sagging is when an $n^+$-type source region flows on a trench sidewall in a direction toward the trench bottom and sags so as to partially cover the surface of the p-type base region therebelow exposed at the trench sidewall. Source sagging on the trench sidewall can be removed by sacrificial oxidation of the surface of the trench inner wall. Accordingly, in the method of manufacturing the conventional silicon carbide semiconductor device, sacrificial oxidation of the surface of the trench inner wall and removal of an oxide layer formed by the sacrificial oxidation have to be performed sequentially after the hydrogen annealing for removing the etching damage of the surface of the trench inner wall.

Nonetheless, the hydrogen annealing is performed at a high temperature of at least 1500 degrees C. and therefore, high-cost annealing equipment is necessary, thereby increasing manufacturing costs. In addition, the time for increasing the temperature of a treatment furnace of the annealing equipment from room temperature (for example, about 25 degrees C.) to a high temperature of at least 1500 degrees C. and the time for lowering the high temperature back to room temperature are long, whereby the treatment time for the hydrogen annealing increases. Intensive research by the inventor reveals that while a clean surface may be achieved by thinly removing the surface of the trench inner wall by sacrificial oxidation, damage (disorder of the SiC crystal structure, crystal defects) occurs at the trench inner wall due to the sacrificial oxidation.

While consideration may be given to performing the trench etching, which uses plasma etching, so that etching damage does not occur to the surface of the trench inner wall or performing the trench etching by soft conditions so that the etching damage of the surface of the trench inner wall is less than by the conventional method, in these instances, the etching speed is too slow and the trench etching does to progress. Therefore, even though significant etching damage occurs at the surface of the trench inner wall by performing the trench etching using the plasma etching under the same conditions as those for the conventional method, it is desirable to find a method that can repair the etching damage at the surface of the trench inner wall by a subsequent process.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A structure of a silicon carbide semiconductor device according to an embodiment is described. FIG. 1 is a cross-sectional view depicting the structure of the silicon carbide semiconductor device according to the embodiment. A silicon carbide semiconductor device 10 according to the embodiment depicted in FIG. 1 is a vertical SiC-MOSFET that has a trench gate structure on a front side of a semiconductor substrate (semiconductor chip) 30 in which silicon carbide (SiC) is used as a semiconductor material. The semiconductor substrate 30 is an epitaxial substrate in which epitaxial layers 32, 33 constituting an $n^-$-type drift region 2 and a p-type base region 3 are sequentially stacked on a front surface of an $n^+$-type starting substrate 31 in which SiC is used as a semiconductor material.

The semiconductor substrate 30 has a main surface (first main surface) that is a surface of the p-type epitaxial layer 33 and assumed as a front surface, and a main surface that is a surface of the $n^+$-type starting substrate 31 (back surface of the $n^+$-type starting substrate 31) and assumed as a back surface. A crystal structure of the semiconductor substrate 30 may be, for example, a silicon carbide four-layer periodic hexagonal crystal structure (4H—SiC). The front surface of the semiconductor substrate 30 may be a (0001) plane, a so-called silicon (Si) plane or a (000-1) plane, a so-called carbon (C) plane. The $n^+$-type starting substrate 31 constitutes an $n^+$-type drain region 1. The $n^-$-type epitaxial layer 32 has a portion that faces the $n^+$-type starting substrate 31 and constitutes the n⁻-type drift region 2; the n⁻-type drift region 2 is adjacent to the n⁺-type starting substrate 31. The p-type base region 3 is provided between the front surface of the semiconductor substrate 30 and the n⁻-type drift region 2.

The trench gate structure is configured by the p-type base region 3, n⁺-type source regions 4, p⁺⁺-type contact regions 5, trenches 6, a gate insulating film 7, and gate electrodes 8. Between the p-type base region 3 and the n⁻-type drift region 2, an n-type current spreading region 23 and p⁺-type regions 21, 22 are each selectively provided at deep positions closer to the n⁺-type drain region 1 than are bottoms of the trenches 6. The n-type current spreading region 23 and the p⁺-type regions 21, 22 are diffused regions formed in the n⁻-type epitaxial layer 32 by ion implantation. A portion of the n⁻-type epitaxial layer 32 excluding the n-type current spreading region 23 and the p⁺-type regions 21, 22 constitutes the n⁻-type drift region 2.

The n-type current spreading region 23 is a so-called current spreading layer (CSL) that reduces carrier spreading resistance. Between the trenches 6 that are adjacent to one another, the n-type current spreading region 23 is in contact with the p-type base region 3 and the n⁻-type drift region 2 along a depth direction and reaches the trenches 6 in a direction parallel to the front surface of the semiconductor substrate 30 to be in contact with the gate insulating film 7. The n-type current spreading region 23 may be omitted. In an instance in which the n-type current spreading region 23 is omitted, instead of the n-type current spreading region 23, the n⁻-type drift region 2 reaches the p-type base region 3 from the n⁺-type drain region 1 and in a direction parallel to the front surface of the semiconductor substrate 30, reaches the trenches 6 to be in contact with the gate insulating film 7.

The p⁺-type regions 21, 22 are fixed to a potential of a later-described source electrode 11 and are depleted when the MOSFET (the silicon carbide semiconductor device 10) is off (or the n-type current spreading region 23 is depleted, or both); the p⁺-type regions 21, 22 have a function of mitigating electric field applied to the gate insulating film 7 at the bottoms of the trenches 6. The p⁺-type regions 21 are apart from the p-type base region 3 and face the bottoms of the trenches 6 in the depth direction, respectively. The p⁺-type regions 21, at a non-depicted portion, are partially connected to the p⁺-type regions 22 or are connected to other p-type regions, thereby being electrically connected to the source electrode 11. The p⁺-type regions 21 may be in contact with the gate insulating film 7 at the bottoms of the trenches 6 or may be apart from the bottoms of the trenches 6.

The p⁺-type regions 21 may face bottom corner portions (corners) of the trenches 6 in the depth direction. In each of the trenches 6, each of the bottom corner portions of the trench 6 is a border between the bottom and a sidewall of the trench 6. Each of the p⁺-type regions 21 faces the bottom corner portions of a respective one of the trenches 6 in the depth direction, whereby electric field applied to the gate insulating film 7 at the bottom corner portions of the respective trench 6 when the MOSFET is off is mitigated, further enhancing an electric field mitigating effect near the bottoms of the trenches 6. Each of the p⁺-type regions 22 depicted in FIG. 1 is provided between a respective adjacent two of the trenches 6 to be separate from the trenches 6 and the p⁺-type regions 21. Each of the p⁺-type regions 22 has a surface that faces the n⁺-type source regions 4 and is in contact with the p-type base region 3; the p⁺-type regions 22 are electrically connected to the source electrode 11 via the p-type base region 3.

The trenches 6 penetrate through the p-type epitaxial layer 33 in the depth direction from the front surface of the semiconductor substrate 30 and reach the n-type current spreading region 23 (in an instance in which the n-type current spreading region 23 is omitted, the n⁻-type drift region 2). At the bottoms of the trenches 6, a crystal surface appears that is the same as that of the front surface of the semiconductor substrate 30. The sidewalls of the trenches 6 may be, for example, a {1-100} plane, a so-called m_plane. Opening corner portions and the bottom corner portions of the trenches 6 may be suitably rounded. In each of the trenches 6, each of the opening corner portions thereof is a border between the front surface of the semiconductor substrate 30 and a sidewall of the trench 6. The surface of the inner walls (the sidewalls and the bottoms) of the trenches 6 constitutes a bonding interface (hereinafter, SiC/SiO$_2$ interface) 20 between the semiconductor substrate 30 and the gate insulating film 7.

Figure 2:
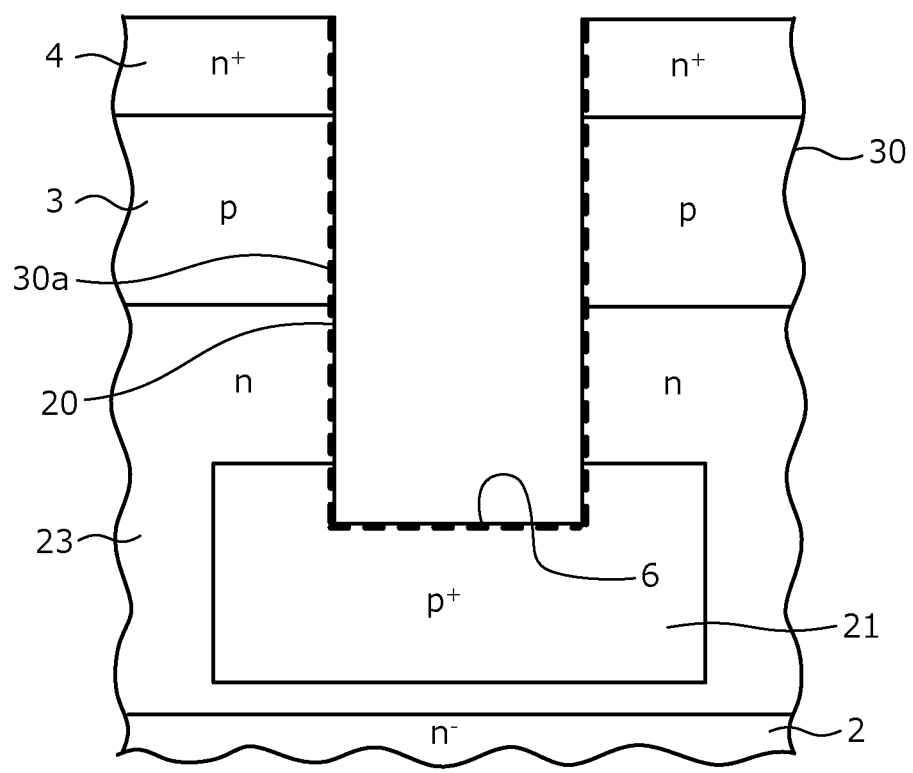
FIG. 2 is an enlarged view of a cross section near a trench after a process at step S3 in FIG. 3.
Figure 3:
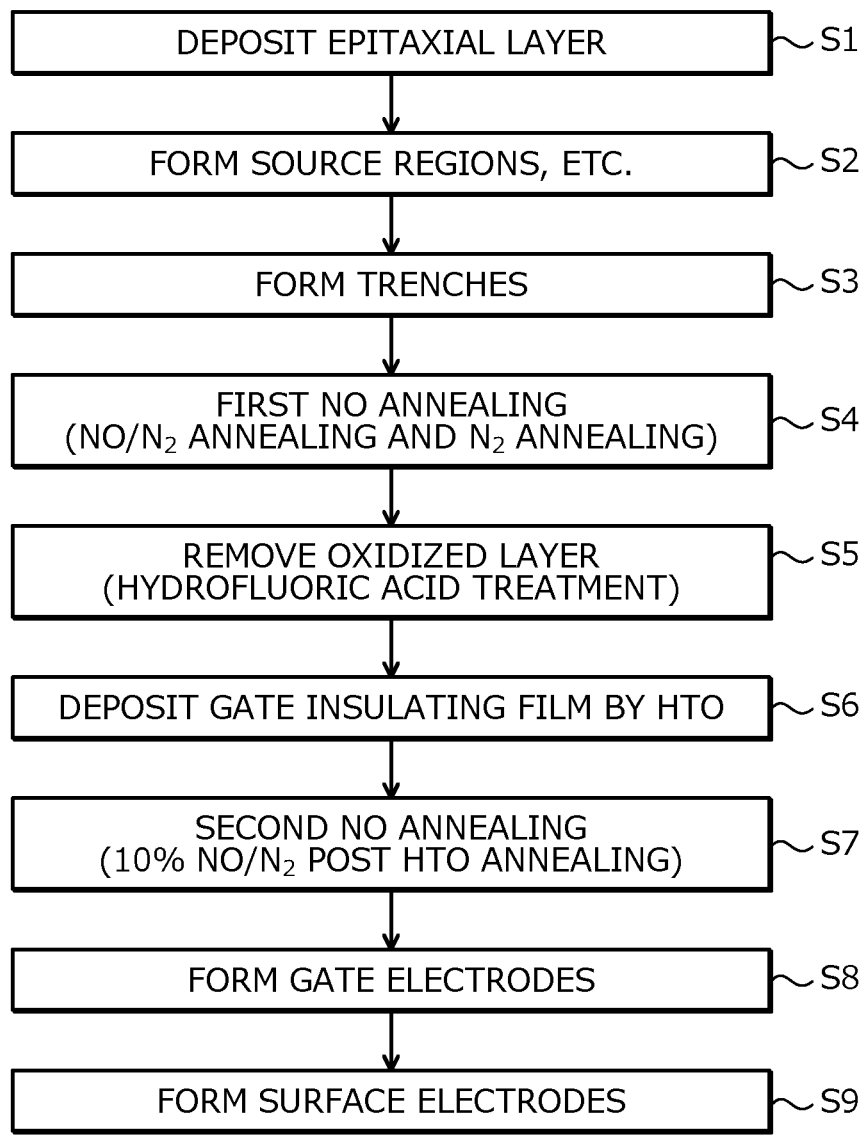
FIG. 3 is a flowchart of an outline of a method of manufacturing the semiconductor device according to the embodiment.

At the surfaces of the inner walls of the trenches 6, etching damage 30a (refer to FIG. 2) that occurs during later-described trench etching (process at step S3, refer to FIG. 3) is repaired by a later-described first NO annealing (process at step S4, refer to FIG. 3). As a result, emission intensity distribution for SiC (refer to FIG. 9) obtained by a cathodoluminescence (CL) technique for a surface area and the surfaces of the inner walls of the trenches 6 satisfies the following conditions. The CL technique is a technique used when states of defects and impurities and/or the crystal structure near the irradiation surface is analyzed from the emission intensity distribution of photons that are emitted by irradiating accelerated electrons on an irradiation surface of an object. Emission intensity distribution is obtained at deeper positions from the irradiation surface (irradiated surface), the greater is the acceleration voltage of the electrons (electron beam) irradiated on the object during analysis by the CL technique (hereinafter, CL analysis).

Figure 5:
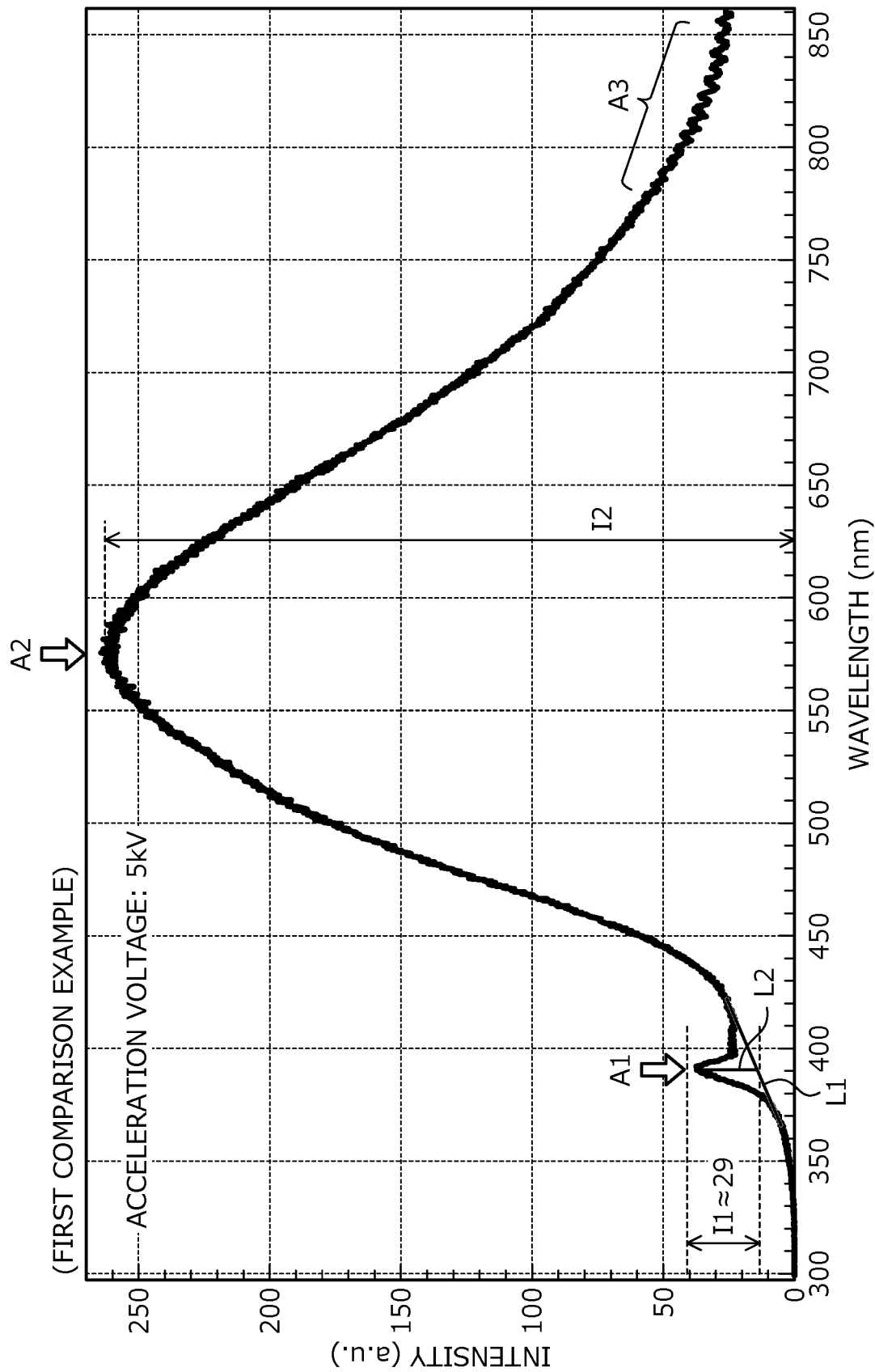
FIG. 5 is an emission intensity distribution for SiC obtained by CL analysis of the first comparison example.

Emission intensity I1 of band edge emission (free exciton emission near observation wavelength 390 nm) D1 for SiC, obtained by CL analysis of surface areas and the surfaces of the inner walls of the trenches 6 is at least the emission intensity I1 of the band edge emissions A1 for SiC in surface areas and at SiC surfaces free of dry etching (refer to FIG. 5). A SiC surface free of dry etching is a surface that has not been exposed to the source gas for the trench etching and may be a portion of the front surface of the semiconductor substrate 30 covered by a trench etching mask, side surfaces (ends) and the back surface of the semiconductor substrate 30, a cross-section obtained by cutting the semiconductor substrate 30 orthogonally to a main surface thereof, etc. In a later-described conventional example, the emission intensity I1 of band edge emissions C1 for SiC in surface areas and at surfaces of inner walls of trenches (refer to FIG. 7) are lower than the emission intensity I1 of the band edge emissions A1 for SiC of the surface areas and SiC surfaces free of dry etching.

Further, in the emission intensity distribution for SiC obtained by the CL analysis for the surface areas and the surfaces of the inner walls of the trenches 6, a ratio of emission intensity I2 of long-wavelength-side broad emission D2 to the emission intensity I1 of the band edge emission D1 (=the emission intensity I2 of the long-wavelength-side broad emission D2/the emission intensity I1 of the band edge emission D1) (hereinafter, emission intensity ratio) is less than an emission intensity ratio of a longwavelength-side broad emission C2 for SiC in the conventional example (refer to FIG. 7) and, for example, is less than about 35 when the acceleration voltage of electrons in the CL analysis is 2 kV, or is about 9 or less when the acceleration voltage of electrons in the CL analysis is 5 kV, or satisfies both (refer to FIG. 10). The long-wavelength-side broad emission D2 for SiC is a peak (mountain-like shape) that is broader (wider) than the band edge emission D1 and occurs further on the long wavelength side (at longer wavelength) than that of a peak (mountain-like shape) of the band edge emission D1 for SiC.

Between the trenches 6 that are adjacent to one another, the $n^+$-type source regions 4 and the $p^{++}$-type contact regions 5 are selectively provided between the front surface of the semiconductor substrate 30 and the p-type base region 3. A portion of the p-type epitaxial layer 33 excluding the $n^+$-type source regions 4 and the $p^{++}$-type contact regions 5 constitutes the p-type base region 3. In portions 3a of the p-type base region 3 along the sidewalls of the trenches 6, channels (n-type inversion layer) are formed when the SiC-MOSFET is on. Etching damage of the surfaces of the inner walls of the trenches 6 is repaired by the later-described first NO annealing (process at step S4, refer to FIG. 3), whereby decreases in electrical characteristics (channel mobility, gate threshold voltage, etc.) of the SiC-MOSFET may be suppressed.

The $n^+$-type source regions 4 and the $p^{++}$-type contact regions 5 are diffused regions formed in the p-type epitaxial layer 33 by ion implantation. The $n^+$-type source regions 4 and the $p^{++}$-type contact regions 5 are exposed at the front surface of the semiconductor substrate 30. Being exposed at the front surface of the semiconductor substrate 30 means being in contact with the later-described source electrode 11 at the front surface of the semiconductor substrate 30. The $n^+$-type source regions 4 are provided closer to the trenches 6 than are the $p^{++}$-type contact regions 5 and are in contact with the gate insulating film 7 at the sidewalls of the trenches 6. The $p^{++}$-type contact regions 5 may be omitted. In an instance in which the $p^{++}$-type contact regions 5 are omitted, instead of the $p^{++}$-type contact regions 5, the p-type base region 3 reaches the front surface of the semiconductor substrate 30 and is exposed.

On the gate insulating film 7 in the trenches 6, the gate electrodes 8 are provided so as to be embedded in the trenches 6. The gate insulating film 7, for example, is a silicon dioxide ($SiO_2$) film deposited by a general high-temperature oxidation (HTO) process. At the inner walls of the trenches 6, the gate insulating film 7 is in contact with the $n^+$-type source regions 4, the p-type base region 3, and the n-type current spreading region 23 (in an instance in which the n-type current spreading region 23 is omitted, the $n^-$-type drift region 2). The gate electrodes 8 are provided in the trenches 6, via the gate insulating film 7. In FIG. 1, while one unit cell (constituent unit of a device element) of the MOSFET is depicted, multiple unit cells of the same trench gate structure are disposed adjacently in the semiconductor substrate 30.

An interlayer insulating film 9 is provided on an entire area of the front surface of the semiconductor substrate 30 and covers the gate electrodes 8. In contact holes of the interlayer insulating film 9, the $n^+$-type source regions 4 and the $p^{++}$-type contact regions 5 (in an instance in which the $p^{++}$-type contact regions 5 are omitted, the p-type base region 3) are exposed. In the contact holes of the interlayer insulating film 9, the source electrode 11 is in ohmic contact with the front surface of the semiconductor substrate 30 and is electrically connected to the $n^+$-type source regions 4, the $p^{++}$-type contact regions 5, and the p-type base region 3. A drain electrode 12 is provided on an entire area of the back surface of the semiconductor substrate 30. The drain electrode 12 is in contact with the $n^+$-type drain region 1 (the $n^+$-type starting substrate 31) and is electrically connected to the $n^+$-type drain region 1.

Operation of the silicon carbide semiconductor device 10 according to the embodiment is described. When voltage that is at least equal to the gate threshold voltage is applied to the gate electrodes 8 in a state in which voltage (forward voltage) that is positive with respect to the source electrode 11 is applied to the drain electrode 12, channels (n-type inversion layers) are formed in the portions of the p-type base region 3 along the sidewalls of the trenches 6. As a result, current flows from the $n^+$-type drain region 1, through the channels to the $n^+$-type source regions 4 and the SiC-MOSFET (the silicon carbide semiconductor device 10) turns on.

On the other hand, when voltage that is lower than the gate threshold voltage is applied to the gate electrodes 8 in a state in which the forward voltage is applied between the source and drain, pn junctions (main junctions) between the $p^+$-type regions 21, 22, the p-type base region 3, the n-type current spreading region 23, and the $n^-$-type drift region 2 are reverse biased, whereby the current stops flowing and the SiC-MOSFET maintains the off state. Further, a depletion layer spreads from the pn junctions to the $p^+$-type regions 21, 22, whereby electric field applied to the gate insulating film 7 at the bottoms of the trenches 6 is mitigated.

Next, a method of manufacturing the silicon carbide semiconductor device 10 according to the embodiment is described with reference to FIGS. 1 to 3. FIG. 2 is an enlarged view of a cross section near a trench after a process at step S3 in FIG. 3. FIG. 3 is a flowchart of an outline of the method of manufacturing the semiconductor device according to the embodiment. First, for example, the $n^+$-type starting substrate (starting wafer) 31 in which 4H—SiC is used as semiconductor material is prepared. The $n^+$-type starting substrate 31 is subject to RCA cleaning and thereafter, the $n^-$-type epitaxial layer 32 that constitutes the $n^-$-type drift region 2 is epitaxially grown (deposited) on a front surface of the $n^+$-type starting substrate 31 (step S1: part 1). The $n^-$-type epitaxial layer 32 has an impurity concentration of, for example, about $1 \times 10^{16}/cm^3$.

The RCA cleaning is wet cleaning in which a SC-1 cleaning and a SC-2 cleaning are performed. In the SC-1 cleaning, the semiconductor wafer is cleaned by being immersed in a mixed aqueous solution containing ammonium hydroxide ($NH_4OH$), hydrogen chloride (HCl), and hydrogen peroxide ($H_2O_2$). Organic matter and particles are removed from the surface (surface in contact with the mixed aqueous solution) of the semiconductor wafer by the SC-1 cleaning. The SC-2 cleaning is performed after the SC-1 cleaning. In the SC-2 cleaning, the semiconductor wafer is cleaned by being immersed in a mixed aqueous solution containing hydrogen chloride (HCl) and hydrogen peroxide ($H_2O_2$). Metal ion contaminants are removed from the surface of the semiconductor wafer by the SC-2 cleaning. A rinsing treatment by pure water (highly purified water: $H_2O$) is performed between the SC-1 cleaning and the SC-2 cleaning.

Next, the $p^+$-type regions 21 and lower portions (portions facing the $n^+$-type drain region 1) of the $p^+$-type regions 22 are each selectively formed in surface regions of the $n^-$-type epitaxial layer 32 by photolithography and ion-implantation of a p-type impurity, so as to be apart from and repeatedly alternate one another. Further, by photolithography and ion-implantation of an n-type impurity, a lower portion of the n-type current spreading region 23 is formed in a surface region of the n⁻-type epitaxial layer 32, between the p⁺-type regions 21 and the p⁺-type regions 22 that are adjacent to one another. A portion of the n⁻-type epitaxial layer 32 closer to the n⁺-type starting substrate 31 than are the p⁺-type regions 21, 22 and the n-type current spreading region 23 constitutes the n⁻-type drift region 2.

Next, by epitaxial growth, the n⁻-type epitaxial layer 32 is made thicker to have a predetermined thickness (step S1: part 2). Next, in the portion of the n⁻-type epitaxial layer 32 epitaxially grown at step S1, upper portions (portions facing the n⁺-type source regions 4) of the p⁺-type regions 22 are selectively formed by photolithography and ion-implantation of a p-type impurity. Further, in the portion of the n⁻-type epitaxial layer 32 epitaxially grown at step S1, an upper portion of the n-type current spreading region 23 is formed by photolithography and ion-implantation of an n-type impurity. The upper portions of the p⁺-type regions 22 and the upper portion of the n-type current spreading region 23 are formed at positions facing, in the depth direction, the lower portions of the p⁺-type regions 22 and the lower portion of the n-type current spreading region 23, respectively, and are continuous with the lower portions of the p⁺-type regions 22 and the lower portion of the n-type current spreading region 23, respectively.

Next, on the n⁻-type epitaxial layer 32, the p-type epitaxial layer 33 that constitutes the p-type base region 3 is epitaxially grown (deposited) (step S1: part 3). By the processes up to here, the semiconductor substrate (semiconductor wafer) 30 in which the epitaxial layers 32, 33 are sequentially stacked on the front surface of the n⁺-type starting substrate 3 is fabricated (manufactured). Next, photolithography and ion implantation are repeatedly performed under different conditions, whereby the n⁺-type source regions 4 and the p⁺⁺-type contact regions 5 are selectively formed in surface regions of the p-type epitaxial layer 33 (step S2). A portion of the p-type epitaxial layer 33 closer to the n⁻-type epitaxial layer 32 than are the n⁺-type source regions 4 and the p⁺⁺-type contact regions 5 constitutes the p-type base region 3.

Next, a heat treatment for impurity activation is performed for all the diffused regions (the p⁺-type regions 21, 22, the n-type current spreading region 23, the n⁺-type source regions 4, and the p⁺⁺-type contact regions 5) formed by ion implantation. The heat treatment for impurity activation may be performed each time diffused regions are formed by ion implantation. Next, as depicted in FIG. 2, the semiconductor substrate 30 is subject to the RCA cleaning and thereafter, the trenches 6 that, in the depth direction, penetrate through the n⁺-type source regions 4 and the p-type base region 3 from the front surface of the semiconductor substrate 30 (the surface of the p-type epitaxial layer 33) and reach the n-type current spreading region 23 are formed by photolithography and etching (hereinafter, trench etching) (step S3: first process).

In the trench etching at step S3, for example, plasma etching equipment is used that advances the etching by externally discharging and removing volatile reaction-products that are generated when a source gas containing, as a base, a fluorine-based gas such as sulfur hexafluoride ($SF_6$) gas or methane tetrafluoride ($CF_4$) gas and oxygen ($O_2$) gas is converted into a high-density plasma and chemically reacts with the SiC (the semiconductor substrate 30). Argon (Ar) gas may be mixed with the source gas for the plasma etching. In the plasma etching, ions in the plasma accelerate, collide with the SiC surface, and chemically react with the SiC, whereby the trench etching advances. Adhesion of, for example, fluorine (F) in the source gas and the etching damage 30a occur at the surfaces of the inner walls of the trenches 6.

In particular, during the trench etching at step S3, due to the collisions of the ions, atomic vacancies, lattice defects (interstitial atoms), dangling bonds (dangling bonds), and impurity defects (impurities other than dopants) occur in the SiC crystal (the semiconductor substrate 30) exposed at the surfaces of the inner walls of the trenches 6. Further, in the SiC crystal exposed at the surfaces of the inner walls of the trenches 6, excess current flows due to conduction currents caused by ion currents and electrons in the plasma, and the above defects occur due to atomic bonds of the SiC crystal being broken by high-energy photons generated by the ion collisions. Due to these defects caused by the plasma etching, the etching damage 30a occurs at the surfaces of the inner walls of the trenches 6. In FIG. 2, portions where the etching damage 30a occurs are indicated by a thick broken line.

Next, the semiconductor substrate 30 is inserted in a heat treatment furnace, a heat treatment (hereinafter, $NO/N_2$ annealing: first heat treatment) under a mixed gas atmosphere in which nitric oxide (NO) gas is mixed with nitrogen ($N_2$) gas at a percentage in a range of, for example, about 5% to 20% and a heat treatment (hereinafter, $N_2$ annealing: second heat treatment) under a nitrogen gas atmosphere are performed in this sequence successively in the same heat treatment furnace (hereinafter, the first NO annealing) (step S4: second process). Due to the first NO annealing at step S4, portions (damaged layers) where the etching damage 30a of the surfaces of the inner walls of the trenches 6 occurs are oxidized, defects (crystal defects, dangling bonds) near the surfaces of the inner walls of the trenches 6 are terminated and reduced by the nitrogen (N), and disorganization of the SiC crystal structure of the semiconductor substrate 30 caused by thermal damage occurring as a consequence of the total treatment time at the maximum temperature of the first NO annealing is repaired.

In particular, the damaged layer of the surface of the inner walls of the trenches 6 is oxidized by the $NO/N_2$ annealing of the first NO annealing. Further, defects near the surfaces of the inner walls of the trenches 6 are terminated and reduced by the nitrogen contained in the NO gas used in the $NO/N_2$ annealing of the first NO annealing. The $N_2$ annealing of the first NO annealing is performed successively after the $NO/N_2$ annealing of the first NO annealing, in the same heat treatment furnace as that for the $NO/N_2$ annealing. In other words, after insertion of the semiconductor substrate 30 into the heat treatment furnace, the semiconductor substrate 30 is removed from the heat treatment furnace after treatment by the $NO/N_2$ annealing and the $N_2$ annealing of the first NO annealing. The oxidation of the surfaces of the inner walls of the trenches 6 advanced by the $NO/N_2$ annealing of the first NO annealing may be stopped by the $N_2$ annealing of the first NO annealing. Further, disorganization of the SiC crystal structure caused by thermal damage that occurs as a consequence of the total treatment time at the maximum temperature of the first NO annealing is repaired by the $N_2$ annealing of the first NO annealing.

For the $NO/N_2$ annealing of the first NO annealing, the treatment temperature is a temperature, for example, in a range of 1200 degrees C. to 1350 degrees C. and the treatment time is in a range of about 15 minutes to 60 minutes. The $N_2$ annealing of the first NO annealing is performed by maintaining the temperature of the heat treatment furnace at the treatment temperature for the $NO/N_2$ annealing of the first NO annealing and switching the gas that is supplied to the heat treatment furnace to a nitrogen gas (100% $N_2$ gas), and the treatment time is set to be in a range of about 30 minutes to 75 minutes. Of the total treatment time (=treatment time of $NO/N_2$ annealing+treatment time of $N_2$ annealing) of the first NO annealing, the total time that the temperature of the heat treatment furnace is a predetermined maximum temperature (the total treatment time at a predetermined maximum temperature of the first NO annealing) is about 90 minutes or longer.

A ratio of the treatment time of the $NO/N_2$ annealing of the first NO annealing and the treatment time of the $N_2$ annealing is suitably adjusted by the depth (i.e., conditions of the trench etching at step S3) of the etching damage 30a occurring at the surface of the inner walls of the trenches 6. Thus, first, the treatment temperature and the treatment time of the $NO/N_2$ annealing of the first NO annealing are set according to the depth of the damaged layer so that the etching damage 30a (damaged layer) that reaches a predetermined depth from the surfaces of the inner walls of the trenches 6 is completely oxidized. Based on the treatment time of the $NO/N_2$ annealing of the first NO annealing, the treatment time of the $N_2$ annealing of the first NO annealing is set so that the total treatment time at a predetermined maximum temperature of the first NO annealing is about 90 minutes or longer.

In the $NO/N_2$ annealing of the first NO annealing at step S4, when the maximum temperature is assumed to be the lowest temperature (about 1200 degrees C.) of the predetermined temperature range described above, the percentage of the NO gas in the mixed gas ($NO/N_2$ gas) is assumed to be the lowest percentage (about 5%), and the treatment time is assumed to be the shortest time (about 15 minutes) (the softest conditions), the oxidized amount (thickness of the oxide layer formed on the SiC surfaces due to oxidation of the SiC surfaces) of the SiC surfaces (the surfaces of the inner walls of the trenches) is about 3 nm. Further, in the $NO/N_2$ annealing at the first NO annealing at step S4, when the maximum temperature is assumed to be the highest temperature (about 1350 degrees) of the predetermined temperature range described above, the percentage of the NO gas in the mixed gas is assumed to be the highest percentage (for example, about 20%), and the treatment time is assumed to be the longest time (for example, 60 minutes) (conditions by which defects are repaired most), the oxidized amount of the SiC surfaces is about 20 nm.

The greater the treatment time for the $N_2$ annealing is in the total treatment time of the first NO annealing at step S4, the smaller the amount of the high-cost NO gas is supplied and therefore, manufacturing cost may be reduced. Further, in the first NO annealing at step S4, the $NO/N_2$ annealing and the $N_2$ annealing are performed successively, whereby the treatment time for the $NO/N_2$ annealing may be adjusted. Therefore, oxidation of the surfaces of the inner walls of the trenches 6 is prevented from progressing too far by the NO gas, which is the source gas of the mixed gas atmosphere used in the first NO annealing and the total treatment time at the predetermined maximum treatment temperature of the first NO annealing may be ensured to be about 90 minutes or longer.

Further, in the conventional method, the hydrogen annealing is performed after the temperature of the heat treatment furnace is raised from room temperature (for example, about 25 degrees) to a high temperature of 1500 degrees C. or higher and therefore, the treatment time of the hydrogen annealing is a few hours. On the other hand, in the present embodiment, for example, in the process at step S4, after the semiconductor substrate 30 is placed in the heat treatment furnace that is maintained at a temperature of about 700 degrees C., the $NO/N_2$ annealing and the $N_2$ annealing are performed successively after the temperature in the heat treatment furnace is raised to a treatment temperature within the predetermined range described above for the $NO/N_2$ annealing of the first NO annealing. Compared to the hydrogen annealing of the conventional method, the maximum temperature of the first NO annealing at step S4 is low, and the time for raising the temperature and the time for lowering the temperature in the heat treatment furnace during the first NO annealing at step S4 may be shortened.

A ratio of the treatment time of the $NO/N_2$ annealing of the first NO annealing and the treatment time of the $N_2$ annealing may be calculated by measuring the depth of the etching damage 30a generated at the surfaces of the inner walls of the trenches 6 after the process at step S3 but before the process at step S4. Alternatively, the depth of the etching damage 30a generated at the surfaces of the inner walls of the trenches 6 may be obtained in advance by simulation based on the conditions of the trench etching at step S3, and the ratio of the treatment time of the $NO/N_2$ annealing of the first NO annealing and the treatment time of the $N_2$ annealing may be calculated. The opening corner portions and the bottom corner portions of the trenches 6 may be suitably rounded by the first NO annealing.

Due to the first NO annealing at step S4, the emission intensity I1 of the band edge emission D1 for SiC (refer to FIG. 9) obtained by the CL analysis of the surface areas and the surfaces of the inner walls of the trenches 6 is at least equal to the emission intensity I1 of the band edge emissions A1 for SiC (refer to FIG. 5) of the surface areas and the SiC surface free of dry etching. Further, in the CL analysis of the surface areas and the surfaces of the inner walls of the trenches 6, the emission intensity ratio of the long-wavelength-side broad emission D2 for SiC is, for example, less than about 35 when the acceleration voltage for electrons in the CL analysis is 2 kV, or at most about 9 when the acceleration voltage for electrons in the CL analysis is 5 kV, or in a state satisfying both.

Next, after the temperature in the heat treatment furnace decreases to, for example, room temperature, the semiconductor substrate 30 is removed. Next, the oxide layer (silicon dioxide ($SiO_2$) layer) formed by oxidation of the damaged layer of the surfaces of the inner walls of the trenches 6 by the process at step S4 is removed by, for example, wet etching using a solution containing fluorine, whereby the surfaces of the inner walls of the trenches 6 are exposed (step S5: third process). Clean surfaces free of damage are exposed at the surfaces of the inner walls of the trenches 6 by the wet etching at step S5. The wet etching at step S5 removes only the oxide layer and does not adversely affect nitrogen termination of the SiC surface. The wet etching at step S5 may use, for example, hydrofluoric acid containing hydrogen fluoride (HF) at a rate in a range of about 5% to 10%, or buffered hydrogen fluoride (BHF), and the treatment time at step S5 may be shortened the higher the fluorine concentration is set.

Next, the $SiO_2$ film (the HTO film) constituting the gate insulating film 7 is deposited (step S6: fourth process). The gate insulating film 7 is constituted by the HTO film, whereby compared to an instance in which the gate insulating film 7 is formed by thermal oxidation, an occurrence of excess carbon (C) at the bonding interface (the $SiC/SiO_2$ interface 20) between the semiconductor substrate 30 (the inner walls of the trenches 6) and the gate insulating film 7 may be suppressed. Next, under a mixed gas atmosphere in which nitric oxide gas is mixed at a percentage of about 10% with nitrogen (N$_2$), a heat treatment (post HTO annealing) is performed, for example, for about 30 minutes (hereinafter, second NO annealing: third heat treatment) (step S7: fifth process). Baking of the gate insulating film 7 is advanced by the second NO annealing and the film density of the gate insulating film 7 increases.

Next, a polysilicon (poly-Si) layer is deposited on the front surface of the semiconductor substrate 30 so as to be embedded in the trenches 6. Subsequently, the polysilicon layer, for example, is etched back and left only in the trenches 6, whereby the gate electrodes 8 are formed (step S8: sixth process). Next, the interlayer insulating film 9 that covers the gate electrodes 8 is formed on the front surface of the semiconductor substrate 30. Next, by a general method, surface electrodes constituting the source electrode 11 and the drain electrode 12 are formed on the front surface and the back surface of the semiconductor substrate 30, respectively (step S9). Thereafter, the semiconductor wafer (the semiconductor substrate 30) is diced (cut) into individual chips, whereby the silicon carbide semiconductor device 10 depicted in FIG. 1 is completed.

Further, in the method of manufacturing the silicon carbide semiconductor device 10 according to the embodiment described above, after the trench etching at step S3 but before the wet etching at step S5, for example, a heat treatment under an argon gas (100% Ar gas) atmosphere at ambient pressure and a temperature of about 1500 degrees C. may be performed, for example, for about 30 minutes. Rearrangement and recrystallization of the SiC crystal of inner surfaces of the trenches 6 may be promoted by the heat treatment under the 100% Ar gas atmosphere. Further, in the heat treatment, the 100% Ar gas atmosphere is used and therefore, the main surfaces of the semiconductor substrate 30 and the surfaces of the inner walls of the trenches 6 are not oxidized.

As described above, according to the embodiment, after the trench etching but before the formation of the gate insulating film, the NO/N$_2$ annealing at a temperature in a range of 1200 degrees C. to 1350 degrees C. under a gas atmosphere containing nitric oxide gas, and the N$_2$ annealing under the nitrogen gas atmosphere maintained at the temperature of the NO/N$_2$ annealing are performed successively, whereby the etching damage of the inner walls of the trenches is oxidized. The total time at the predetermined maximum temperature is at least 90 minutes of the total treatment time of these annealing treatments. The oxide layer formed by oxidation of the etching damage of the inner walls of the trenches is removed, thereby exposing clean surfaces of the inner walls of the trenches.

According to the embodiment, the NO/N$_2$ annealing and the N$_2$ annealing are performed successively, thereby removing the etching damage of the inner walls of the trenches and thus, a high-temperature hydrogen annealing that uses high-cost annealing equipment like that of the conventional method is unnecessary. Thus, manufacturing costs may be reduced. Further, according to the embodiment, the maximum temperature of the NO/N$_2$ annealing and the N$_2$ annealing (the first NO annealing) is lower than the temperature of the hydrogen annealing performed for removing the etching damage of the inner walls of the trenches in the conventional method and therefore, the time for raising the temperature and the time for lowering the temperature in the heat treatment furnace during the first NO annealing may be shortened. As a result, the manufacturing time may be shortened.

Further, according to the embodiment, by the first NO annealing, etching damage of the surface areas of the inner walls of the trenches is removed, defects of the SiC crystal are terminated by nitrogen and reduced, and the SiC crystal structure is repaired. As a result, the emission intensity of the band edge emission for SiC obtained by the CL analysis of the surface areas of the inner walls of the trenches is at least equal to the emission intensity of the band edge emission for SiC obtained by the CL analysis of the surfaces free of dry etching. As a result, decreases in the electrical characteristics (channel mobility, gate threshold voltage, etc.) of the SiC-MOSFET may be prevented and compared to the conventional method, the electrical characteristics of the SiC-MOSFET may be enhanced.

The etching damage 30a (refer to FIG. 2) of the SiC surface due to dry etching (corresponds to the trench etching at step S3, refer to FIG. 3) was verified. FIG. 4 is a table of band edge emission intensity ratios for SiC obtained by CL analysis of a first comparison example, a second comparison example, the conventional example, and an example. In FIG. 4, the emission intensity I1 of the band edge emission for SiC in the first comparison example is assumed as a reference (=1.0), and ratios (band edge emission intensity ratio) of the emission intensity I1 of the band edge emissions for SiC in the second comparison example, the conventional example, and the example, to the emission intensity I1 of the band edge emission for SiC in the first comparison example are shown.

Figure 6:
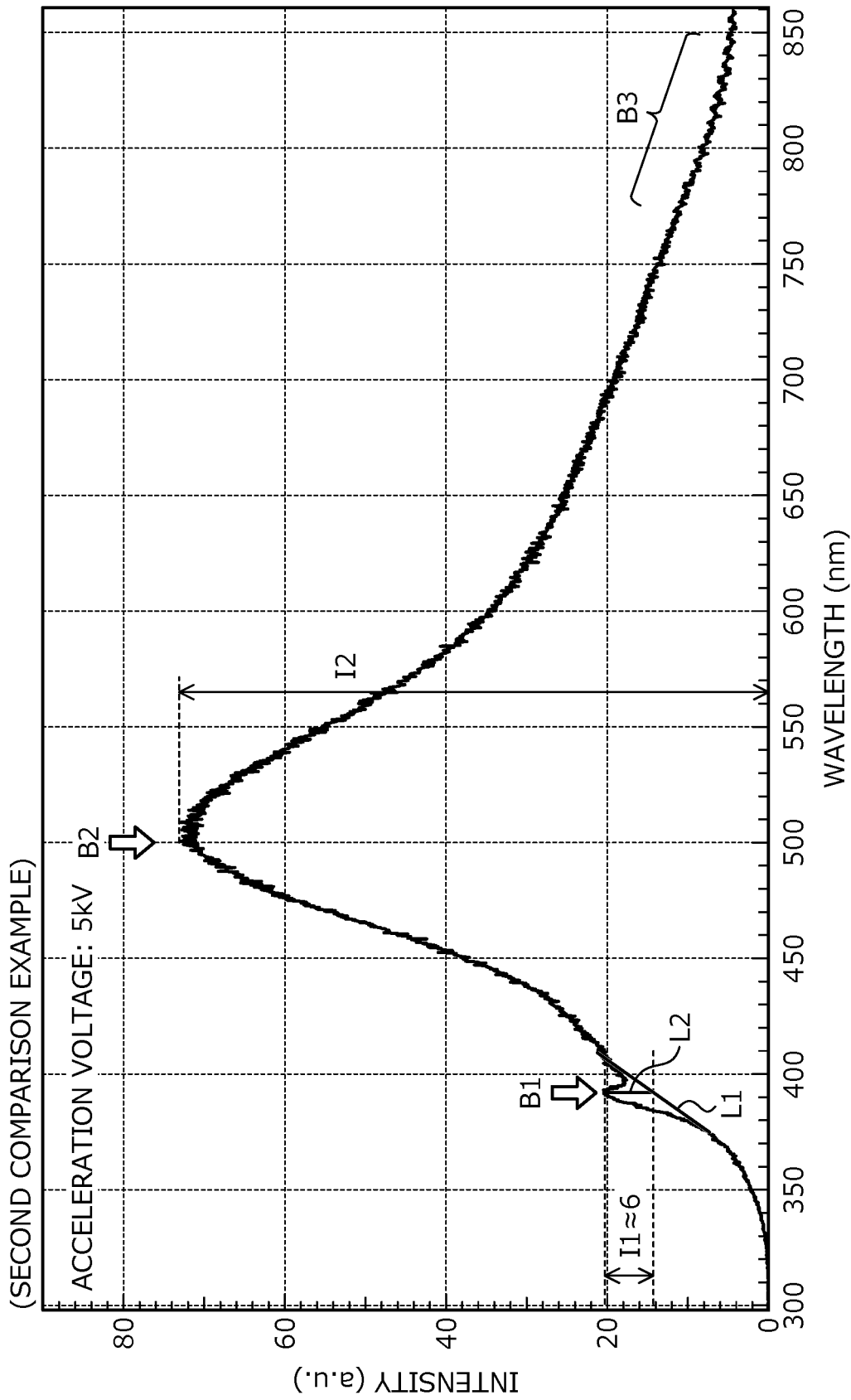
FIG. 6 is an emission intensity distribution for SiC obtained by CL analysis of the second comparison example.
Figure 7:
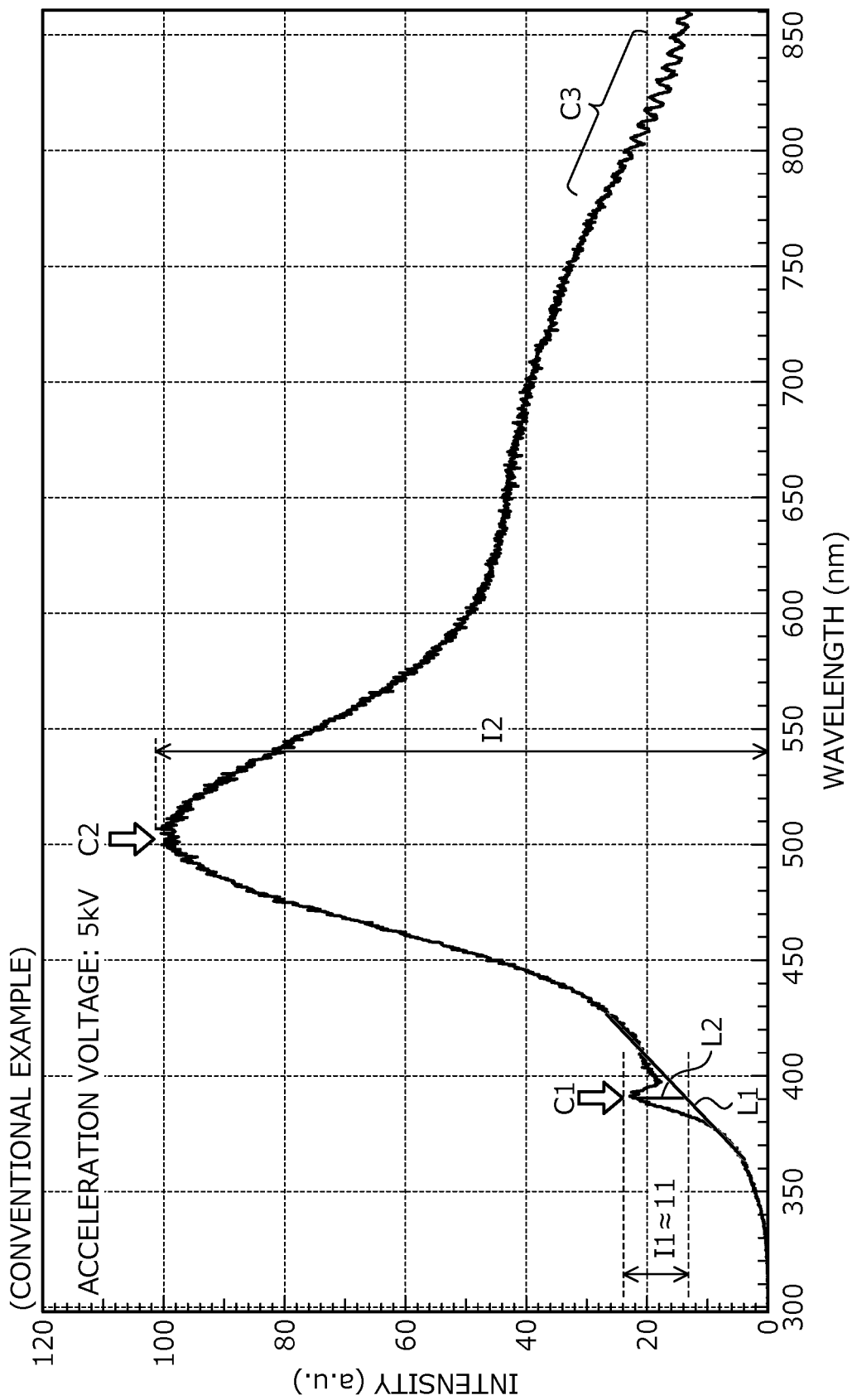
FIG. 7 is an emission intensity distribution for SiC obtained by CL analysis of the conventional example.
Figure 8:
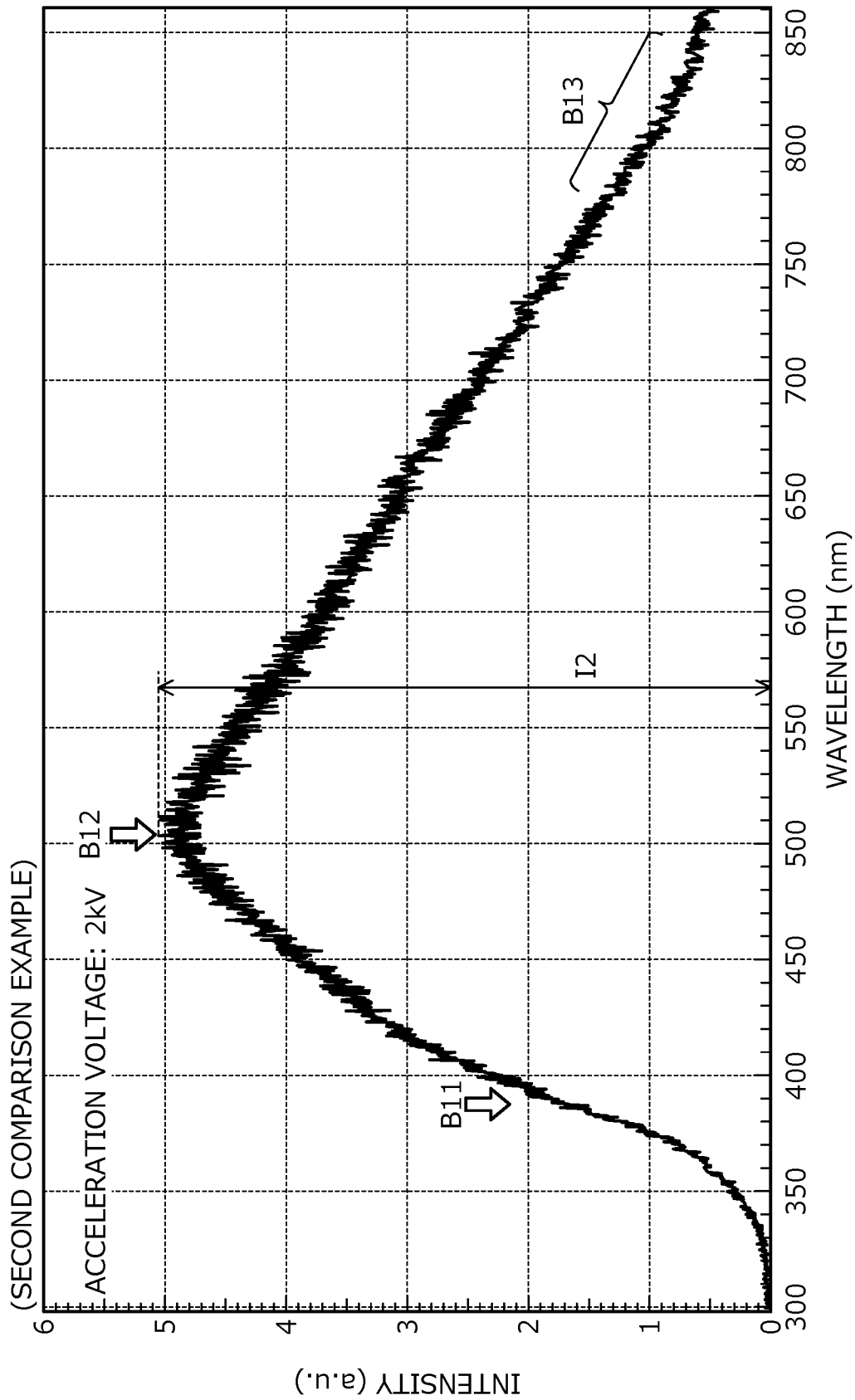
FIG. 8 is an emission intensity distribution for SiC obtained by CL analysis of the second comparison example.
Figure 9:
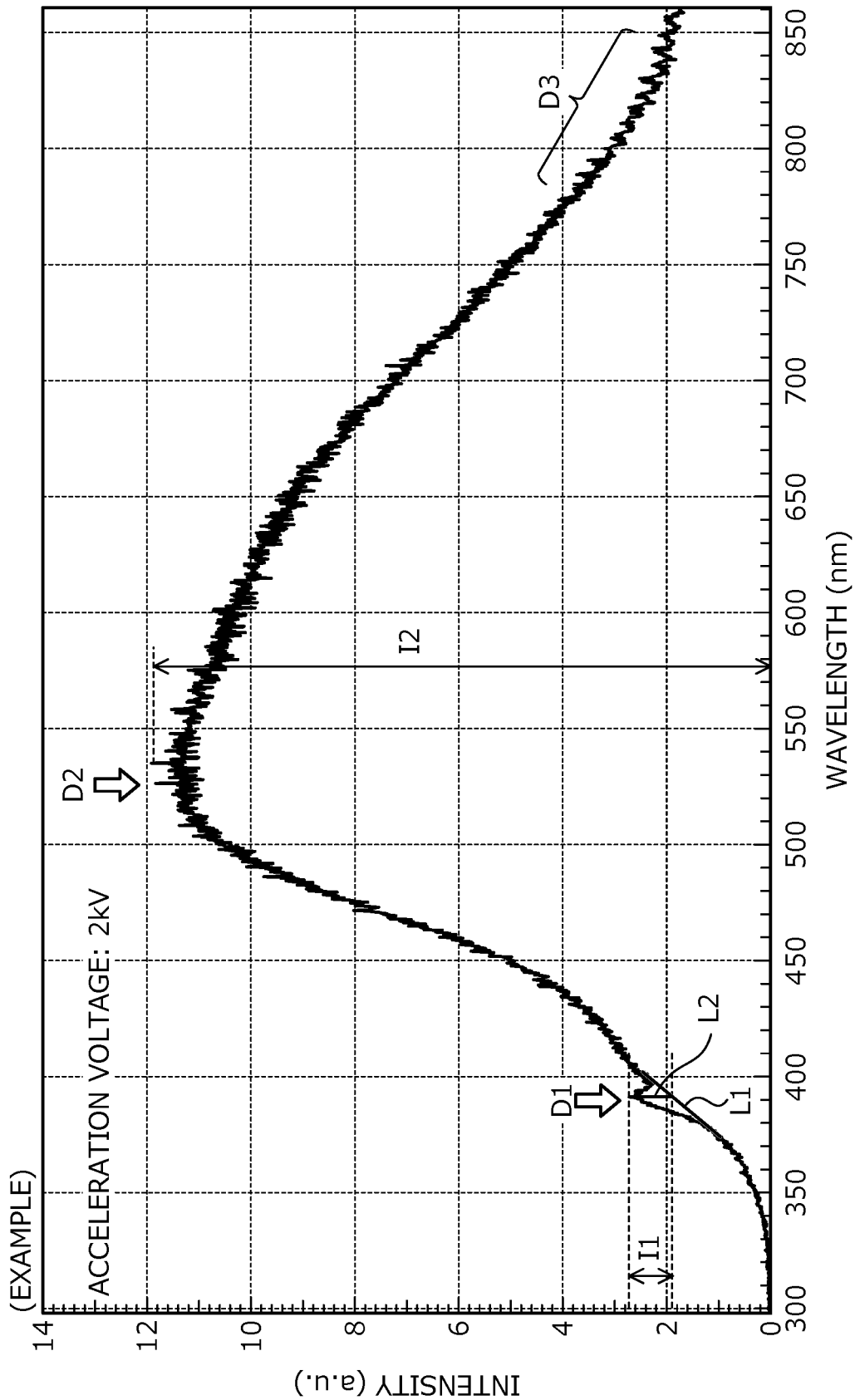
FIG. 9 is an emission intensity distribution for SiC obtained by CL analysis of the second comparison example and the example.

FIGS. 5, 6, and 7 are emission intensity distributions for SiC obtained by CL analysis of the first comparison example, the second comparison example, and the conventional example, respectively. FIGS. 8 and 9 are emission intensity distributions for SiC obtained by CL analysis of the second comparison example and the example. FIGS. 5 to 7 show results of the CL analysis for an instance in which the acceleration voltage of the electron beam is assumed to be 5 kV. FIGS. 4, 8, and 9 show results of the CL analysis for an instance in which the acceleration voltage of the electron beam is assumed to be 2 kV. In FIG. 4, the emission intensity I1 of band edge emissions B11, D1 for SiC in the second comparison example and the example are calculated with reference to the emission intensity distribution for SiC in FIGS. 8 and 9.

As the example, the first comparison example, the second comparison example, and the conventional example, flat plate-shaped epitaxial substrates (hereinafter, m_plane substrates) were prepared, respectively, in which an n$^-$-type epitaxial layer having an impurity concentration of 1×10$^{16}$/cm$^3$ and a thickness of 5 μm was grown on one of the main surfaces of a starting substrate that contained SiC and had m_planes as the main surfaces (corresponds to step S1 (part 1) in FIG. 3). The epitaxial substrate has a first main surface and a second main surface opposite to each other, the first main surface having the n$^-$-type epitaxial layer and in the example, the first comparison example, the second comparison example, and the conventional example, a predetermined process (process not performed in the first comparison example) and the CL analysis were performed with respect to the first main surface (m_plane) of the epitaxial substrate.

In particular, in the example, the first main surface of the epitaxial substrate is dry etched (corresponds to the trench etching at step S3 in FIG. 3), and the thickness of the epitaxial substrate (thickness of the n$^-$-type epitaxial layer) is reduced to a predetermined thickness. According to the method of manufacturing the silicon carbide semiconductor device of the embodiment described above, the first main surface (m_plane) of the epitaxial substrate was exposed by the dry etching, and the first NO annealing at step S4 and the wet etching at step S5 were performed on the first main surface.

The dry etching of the first main surface of the epitaxial substrate was plasma etching that used a mixed gas containing a fluorine-based gas and oxygen gas. As the mixed gas containing a fluorine-based gas and oxygen gas, a mixed gas ($SF_6/O_2$ gas) containing $SF_6$ gas and $O_2$ gas, a mixed gas ($CF_4/O_2$ gas) containing $CF_4$ gas and $O_2$ gas, a mixed gas ($SF_6/O_2/Ar$ gas) containing $SF_6$ gas, $O_2$ gas, and argon (Ar) gas, or a mixed gas ($CF_4/O_2/Ar$ gas) containing $CF_4$ gas, $O_2$ gas, and Ar gas is used.

In the first NO annealing at step S4, the $NO/N_2$ annealing was performed at a temperature of 1300 degrees C. (maximum temperature of the first NO annealing) for 30 minutes under a mixed gas (10% $NO/N_2$ gas) atmosphere in which the NO gas was mixed at a percentage of 10% with $N_2$ gas and thereafter, the temperature (1300 degrees C.) for the $NO/N_2$ annealing was maintained, nitrogen gas was introduced into the heat treatment furnace, thereby switching the atmosphere to a nitrogen gas (100% $N_2$ gas) atmosphere, and the $N_2$ annealing was performed for 60 minutes. The wet etching at step S5 used hydrofluoric acid that contained 5% HF (dry etching+successive $NO/N_2$ and $N_2$ heat treatments+removal of oxide layer).

Thereafter, the CL analysis was performed with respect to the example for instances assuming the acceleration voltage of the electron beam to be 2 kV and 5 kV, respectively, and the emission intensity distribution for SiC of the first main surface (SiC surface) of the epitaxial substrate was obtained. The emission intensity distribution for SiC obtained by the CL analysis for the instance in which the acceleration voltage of the electron beam was assumed to be 2 kV was the emission intensity distribution for SiC of a portion (portion near the SiC surface) closer to the first main surface of the epitaxial substrate than that for the emission intensity distribution for SiC obtained by the CL analysis for the instance in which the acceleration voltage of the electron beam was assumed to be 5 kV.

The first comparison example differs from the example in that the dry etching and subsequent processes were not performed (no dry etching). In other words, the first comparison example was a sample in which only epitaxial growth of the $n^-$-type epitaxial layer on the m_plane substrate was performed. The second comparison example differs from the example in that the process at step S4 and the process at step S5 were not performed (only dry etching). In other words, the second comparison example was a sample in which the first main surface of the epitaxial substrate was dry etched under the same conditions as those for the example.

The conventional example differed from the example in that instead of the process at step S4 and the process at step S5, the first main surface (m_plane) of the epitaxial substrate was subjected to sacrificial oxidation by a heat treatment performed for 60 minutes at a temperature of 1150 degrees C. under an oxygen gas atmosphere, and subsequently the oxide layer formed by the sacrificial oxidation was removed by hydrofluoric acid (dry etching+sacrificial oxidation+removal of oxide layer). The emission intensity distribution for SiC by the CL analysis of the first main surface of the epitaxial substrate was obtained for the first comparison example, the second comparison example, and the conventional example, similarly to the example.

The emission intensity distributions for SiC obtained by the CL analysis for instances in which the acceleration voltage of the electron beam was assumed to be 5 kV in the first comparison example, the second comparison example, and the conventional example are shown in FIGS. 5 to 7. The emission intensity distributions for SiC obtained by the CL analysis for the instances in which the acceleration voltage of the electron beam was assumed to be 2 kV in the second comparison example and the example are shown in FIGS. 8 and 9. The emission intensity distributions for SiC obtained by the CL analysis for the instances in which the acceleration voltage of the electron beam was assumed to be 2 kV in the first comparison example and the conventional example and the emission intensity distribution for SiC obtained by the CL analysis for instance in which the acceleration voltage of the electron beam was assumed to be 5 kV in the conventional example are not shown. In all the emission intensity distributions for SiC, a peak (mountain-like shape) of interband transition emission (band edge emission) was observed near the wavelength 390 nm.

Further, in the emission intensity distributions for SiC in the example, the first comparison example, the second comparison example, and the conventional example, a broad peak of emission broader than that the peak of the band edge emission was observed at a wavelength longer than that of the peak of the band edge emission. Defects (defects that are non-emission centered) increase the weaker is the emission intensity I1 of the band edge emission for SiC. Therefore, the magnitude of process damage may be confirmed by the emission intensity I1 of the band edge emission for SiC. The long-wavelength-side broad emission for SiC is emission caused by point defects that occur in the $n^-$-type epitaxial layer. The long-wavelength-side broad emission for SiC was verified by a later-described second experimental example.

For the example, the first comparison example, the second comparison example, and the conventional example, the emission intensity I1 of the band edge emission for SiC (free exciton emission near observation wavelength 390 nm) was calculated from the emission intensity distributions for SiC obtained by the CL analysis for the instances in which the acceleration voltage of the electron beam was assumed to be 2 kV and 5 kV. A method of calculating the emission intensity I1 of the band edge emission for SiC is described, for example, with reference to FIG. 5. In the emission intensity distribution for SiC, an auxiliary line L1 connecting troughs (vertex portions of downward protrusions of left and right ends of one wavelength) of the band edge emission A1 for SiC, and an auxiliary line L2 passing orthogonally through a vertex (vertex portion of an upward protrusion indicating the maximum intensity of one wavelength) of the peak of the band edge emission A1 for SiC are added.

An amplitude from an intersection of the auxiliary lines L1, L2 to the vertex of the peak of the band edge emission A1 for SiC is the emission intensity I1 of the band edge emission A1 for SiC. For example, the emission intensity I1 of the band edge emission A1 for SiC obtained by the CL analysis for the instance in which the acceleration voltage of the electron beam in the first comparison example depicted in FIG. 5 is assumed to be 5 kV is about 29. The emission intensity I1 of the band edge emission B1 for SiC obtained by the CL analysis for the instance in which the acceleration voltage of the electron beam of the second comparison example depicted in FIG. 6 is assumed to be 5 kV is about 6. The emission intensity I1 of the band edge emission C1 for SiC obtained by the CL analysis for the instance in which the acceleration voltage of the electron beam of the conventional example depicted in FIG. 7 was assumed to be 5 kV is about 11.

The ratios of the emission intensity I1 of the band edge emissions for SiC in the example, the second comparison example, and the conventional example, to the emission intensity I1 of the band edge emission for SiC in the first comparison example were calculated. Intensity ratios of the band edge emissions for SiC obtained by the CL analysis for the instances in which the acceleration voltage of the electron beam in the example, the first comparison example, the second comparison example, and the conventional example was assumed to be 2 kV are shown in FIG. 4. In the first comparison example, only formation of the n⁻-type epitaxial layer on the m_plane substrate is performed and therefore, the emission intensity I1 of the band edge emission for SiC in the first comparison example is a value when process damage is absent.

A ratio of the intensity of the band edge emission for SiC in the example is a result obtained by dividing the emission intensity I1 of the band edge emission D1 for SiC in the example by the emission intensity I1 of the band edge emission for SiC in the first comparison example. A ratio of the intensity of the band edge emission for SiC in the second comparison example is a result obtained by dividing the emission intensity I1 of the band edge emission B11 for SiC in the second comparison example by the emission intensity I1 of the band edge emission for SiC in the first comparison example. A ratio of the intensity of the band edge emission for SiC in the conventional example is a result obtained by dividing the emission intensity I1 of the band edge emission for SiC in the conventional example by the emission intensity I1 of the band edge emission for SiC in the first comparison example.

From the result shown in FIG. 4, it was confirmed that in the second comparison example, the emission intensity I1 of the band edge emission B11 for SiC was about ⅕ times the emission intensity I1 of the band edge emission for SiC in the first comparison example, and the emission intensity I1 of the band edge emission B11 for SiC was weaker than that than in the first comparison example. It was found that in the second comparison example, due to the dry etching, etching damage (process damage) occurred at the SiC surface (first main surface of the epitaxial substrate having the n⁻-type epitaxial layer) and defects (defects that are non-emission centered) increased compared to before the dry etching (corresponds to the first comparison example).

Further, from the results shown in FIG. 4, it was confirmed that in the conventional example, the emission intensity I1 of the band edge emission for SiC was about ⅖ times the emission intensity I1 of the band edge emission for SiC in the first comparison example, and the emission intensity I1 of the band edge emission for SiC was slightly stronger than that in the second comparison example. In the conventional example, it was found that while damage (defects that are non-emission centered) of the SiC surface due to the dry etching is repaired by the sacrificial oxidation, the amount of repair is small.

Meanwhile, from the results shown in FIG. 4, it was confirmed that in the example, the emission intensity I1 of the band edge emission D1 for SiC is about 1.35 times the emission intensity I1 of the band edge emission for SiC in the first comparison example. It was found that damage of the SiC surface could be reduced more by the processes at steps S4 and S5 as compared to the instance in which the dry etching was not performed (the first comparison example). Further, it was confirmed that in the example, the emission intensity I1 of the band edge emission for SiC is stronger than that in the second comparison example and the conventional example. It was found that damage of the SiC surface could be repaired more by the processes at steps S4 and S5 as compared to after the dry etching (the second comparison example) and the conventional method (sacrificial oxidation).

In FIG. 4, the CL analysis results for the instance in which the acceleration voltage of the electron beam is assumed to be 2 kV are shown and while the CL analysis results for the instance in which the acceleration voltage of the electron beam is assumed to be 5 kV are not shown, in the CL analysis for the instance in which the acceleration voltage of the electron beam is assumed to be 5 kV, results are obtained that show a trend similar to that in FIG. 4.

Further, the emission intensity I1 of the band edge emission B11 for SiC obtained by the CL analysis for the instance in which the acceleration voltage of the electron beam in the second comparison example shown in FIG. 8 was assumed to be 2 kV was confirmed to significantly weaker than the emission intensity I1 of the band edge emission B1 for SiC obtained by the CL analysis for the instance in which the acceleration voltage of the electron beam in the second comparison example depicted in FIG. 6 was assumed to be 5 kV. In FIG. 8, while the reference character I1 of the emission intensity is not shown, the emission intensity I1 is calculated by the same method as that for the band edge emissions A1, B1, C1, D1 for SiC in FIGS. 5 to 7, and 9.

In the instance in which the acceleration voltage of the electron beam was assumed to be 2 kV, the portion that is analyzed is shallower from the SiC surface as compared to the instance in which the acceleration voltage of the electron beam was assumed to be 5 kV. From the results shown in FIGS. 6 and 8, it was confirmed that damage due to the dry etching was concentrated in a relatively shallow portion close to the SiC surface. Therefore, it was found that the electrical characteristics of the SiC-MOSFET may be improved by repairing the damage of the relatively shallow portion close to the SiC surface.

The emission intensity I1 of the band edge emission D1 for SiC obtained by the CL analysis for the instance in which the acceleration voltage of the electron beam was assumed to be 2 kV in the example depicted in FIG. 9 is clearly stronger than the emission intensity I1 of the band edge emission B11 for SiC obtained by the CL analysis for the instance in which the acceleration voltage of the electron beam was assumed to be 2 kV in the second comparison example depicted in FIG. 8. Therefore, it was found that the damage of relatively shallow portions close to the SiC surface resulting from the dry etching may be significantly restored by the processes at steps S4 and S5.

Therefore, by performing the processes at steps S4 and S5 on the SiC surface (first main surface of the epitaxial substrate, having the n⁻-type epitaxial layer) similarly as in the example, the gate insulating film 7 may be formed on the semiconductor substrate 30 (surfaces of the inner walls of the trenches 6) without damage remaining at an interface (the SiC/SiO₂ interface 20, refer to FIG. 1) between the semiconductor substrate 30 and the gate insulating film 7.

Troughs (vertex portions of downward protrusions of left and right ends of one wavelength: reference characters A3, B3, C3, B13, and D3 in FIGS. 5 to 9) of long-wavelength-side broad emissions in the emission intensity distribution for SiC are periodic changes in intensity and are caused by the analysis equipment.

In the second experimental example, long-wavelength-side broad emission in the emission intensity distribution for SiC was verified. Long-wavelength-side broad emissions for SiC (corresponds to reference characters A2, B2, C2, B12, and D2 in FIGS. 5 to 9) occur with wavelengths longer than wavelengths of the peaks of band edge emission (near observation wavelength 390 nm, corresponds to reference characters A1, B1, C1, B11, and D1 in FIGS. 5 to 9) in the emission intensity distribution for SiC, and are peaks that are broader than that of the band edge emission D1. Long-wavelength-side broad emission is emission caused by point defects in the n⁻-type epitaxial layer, not emission caused by etching damage due to the dry etching.

Point defects in the n⁻-type epitaxial layer increase the stronger is the emission intensity I2 (refer to FIGS. 5 to 9) of the long-wavelength-side broad emission. When the emission intensity I2 of the long-wavelength-side broad emission is weak, point defects in the n⁻-type epitaxial layer decrease and device quality may be enhanced. The emission intensity I2 of the long-wavelength-side broad emission for SiC is the amplitude from the emission intensity=0 to a vertex (vertex portion of an upward protrusion indicating the maximum intensity of one wavelength) of a peak of the long-wavelength-side broad emission for SiC.

Therefore, preferably, the emission intensity I1 of the band edge emission for SiC may be strong and the emission intensity I2 of long-wavelength-side broad emission may be weak. For example, it may be said that when the ratio (the emission intensity ratio=the emission intensity I2 of long-wavelength-side broad emission/the emission intensity I1 of band edge emission) of the emission intensity I2 of long-wavelength-side broad emission to the emission intensity I1 of the band edge emission for SiC is small, process damage due to the dry etching or the like decreases and point defects in the n⁻-type epitaxial layer also decrease. The emission intensity ratios of long-wavelength-side broad emission for SiC in the first comparison example, the second comparison example, the conventional example, and the example are shown in FIG. 10.

FIG. 10 is a table showing the emission intensity ratio of long-wavelength-side broad emission for SiC in the example. FIG. 10 further shows the emission intensity ratios of long-wavelength-side broad emission for SiC in the first comparison example, the second comparison example, and the conventional example. In FIG. 10, the emission intensity ratios of long-wavelength-side broad emission for SiC obtained by the CL analysis for the instances in which the acceleration voltage of the electron beam in the second comparison example and the example was assumed to be 2 kV refer to FIGS. 8 and 9. The emission intensity ratios of long-wavelength-side broad emission for SiC obtained by the CL analysis for the instances in which the acceleration voltage of the electron beam in the first comparison example, the second comparison example, and the conventional example was assumed to be 5 kV refer to FIGS. 5 to 7, respectively.

From the results shown in FIG. 10, it was confirmed that the emission intensity ratio of long-wavelength-side broad emission for SiC was smaller in the example described above than in the first comparison example, the second comparison example, and the conventional example described above. Therefore, it was found that by performing the processes at steps S4 and S5 on the SiC surface (first main surface of the epitaxial substrate, having the n⁻-type epitaxial layer) like in the example, etching damage due to the dry etching may be reduced and point defects in the n⁻-type epitaxial layer may also be reduced.

For example, the emission intensity ratio of long-wavelength-side broad emission for SiC in the conventional example was about 35 at a relatively shallow portion closer to the SiC surface (in an instance of the CL analysis in which the acceleration voltage of the electron beam was assumed to be 2 kV), and was about 9.1 at a deep portion from the SiC surface (in an instance of the CL analysis in which the acceleration voltage of the electron beam was assumed to be 5 kV). On the other hand, it was confirmed that in the example, the emission intensity ratio of long-wavelength-side broad emission for SiC was about 17 at a relatively shallow portion close to the SiC surface, was about 7.5 at a deep portion from the SiC surface, and could be set to be smaller than the emission intensity ratio of long-wavelength-side broad emission for SiC in the conventional example. In other words, it was confirmed that in the present embodiment, the emission intensity ratio of long-wavelength-side broad emission for SiC may be set to be less than about 35 at a relatively shallow portion close to the SiC surface and could be set to about 9 or less at a deep portion from the SiC surface.

Further, as described above, emission intensity distribution that includes information from the SiC surface to a deep portion is obtained the higher is the acceleration voltage of the electron beam in the CL analysis, and etching damage due to the dry etching is greater at a relatively shallow portion close to the SiC surface and decreases with increasing depth from the SiC surface (refer to FIGS. 6 and 8). In an instance in which damage of the SiC surface is removed by sacrificial oxidation like in the conventional example, damage occurs from the SiC surface to a deep portion (refer to FIG. 7). Further, the SiC surface is oxidized in the sacrificial oxidation. Furthermore, in the sacrificial oxidation, dangling bonds at the SiC surface are not terminated by nitrogen. Therefore, in the conventional example, the amount of repair of the damage of the SiC surface is small. On the other hand, it was confirmed that in the example, deep portions from the SiC surface are free of damage.

In a third experimental example, channel mobility and the gate threshold voltage of the silicon carbide semiconductor device 10 according to the embodiment were verified. FIG. 11 is a table showing electrical characteristics (channel mobility and gate threshold voltage) of the example. FIG. 11 further shows electrical characteristics of the second comparison example and the conventional example. A trench gate SiC-MOSFET (hereinafter, the example) was manufactured according to the method of manufacturing the silicon carbide semiconductor device 10 of the embodiment described above (refer to FIG. 3) and the trench etching at step S3, the first NO annealing at step S4, and the wet etching at step S5 were performed under the above-described conditions for the example.

A further trench gate SiC-MOSFET (hereinafter, the second comparison example) was fabricated according to the above-described method of manufacturing the silicon carbide semiconductor device 10 according to the embodiment, except that the process at step S4 and the process at step S5 were omitted (i.e., only step S3 was performed under the above-described conditions for the second comparison example). Another trench gate SiC-MOSFET was fabricated (hereinafter, the conventional example) by sacrificial oxidation and removal of the oxide layer formed by the sacrificial oxidation (i.e., damage is repaired by the conditions of the above-described conventional example) instead of the process at step S4 and the process at step S5.

Results of measurement of channel mobility and gate threshold voltage for the second comparison example, the conventional example, and the example are shown in FIG. 11. From the results shown in FIG. 11, it was confirmed that channel mobility could be increased in the example, compared to that in the second comparison example and the conventional example. For example, in the example, it was possible to increase the channel mobility 22% compared to that in the conventional example. Further, it was confirmed that channel mobility is lower the greater is the damage that remains near the SiC surface (refer to FIG. 4).

Therefore, it was confirmed that the etching damage 30a of the surfaces of the inner walls of the trenches 6 adversely affects the electrical characteristics of the SiC-MOSFET. Further, it was confirmed that similarly to the example, the electrical characteristics of the SiC-MOSFET may be improved by suppressing and repairing, within a suitable range, the etching damage 30a of the surfaces of the inner walls of the trenches 6 occurring due to the trench etching at step S3.

In the first and the second experimental examples described above, while the CL analysis is performed by irradiating an electron beam on the main surface (m_plane) of the epitaxial substrate, without being limited hereto, the CL analysis may be performed by irradiating an electron beam on the sidewalls of the trenches, which reach a predetermined depth from the main surface of the epitaxial substrate.

In the foregoing, the present invention is not limited to the described embodiments and may be variously modified within a range not departing from the spirit of the inventions. For example, instead of the vertical MOSFET, the present invention is applicable to a vertical insulated gate bipolar transistor (IGBT) or a vertical SJ-MOSFET, in which a trench gate structure may be adopted. A SJ-MOSFET is a MOSFET with a superjunction (SJ) structure having a parallel pn layer in which p-type regions and n-type regions with an increased impurity concentration are disposed in a drift layer so as to repeatedly alternate one another in a direction parallel to the front surface of the semiconductor substrate.

According to the invention described above, after formation of the trenches by etching but before formation of the gate insulating film, the first heat treatment and the second heat treatment are performed successively, whereby clean faces are exposed at the surfaces of the inner walls of the trenches. As a result, unlike the conventional method, high-temperature hydrogen annealing that uses high-cost annealing equipment is unnecessary to remove the etching damage of the inner walls of the trenches. Further, according to the invention described above, the maximum temperature of the first heat treatment and the second heat treatment is lower than the temperature of the hydrogen annealing performed to remove the etching damage of the inner walls of the trenches in the conventional method, whereby the time for raising the temperature and the time for lowering the temperature in the heat treatment furnace during the second process may be shortened. Further, according to the invention described above, decreases in channel mobility and variation of the gate threshold voltage may be prevented.

The silicon carbide semiconductor device and the method of manufacturing a silicon carbide semiconductor device according to the invention achieve an effect in that cost may be reduced, manufacturing time may be shortened, and electrical characteristics may be enhanced.

As described above, the silicon carbide semiconductor device and the method of manufacturing a silicon carbide semiconductor device according to the invention are useful for power semiconductor devices used in power converting equipment, power source devices such as those of various type of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having an insulated gate with a three-layered structure including a gate, an oxide film, and a semiconductor, the silicon carbide semiconductor device, comprising:
    a semiconductor substrate containing silicon carbide and constituting the semiconductor, the semiconductor substrate having a main surface; and
    a trench gate structure including the gate, the oxide film, and the semiconductor, the trench gate structure further including
    a trench having a predetermined depth below the main surface of the semiconductor substrate, in a depth direction;
    a gate insulating film provided along an inner wall of the trench, the gate insulating film being in contact with the semiconductor substrate at the inner wall of the trench and constituting the oxide film; and
    a gate electrode provided on the gate insulating film in the trench, the gate electrode constituting the gate, wherein
    the trench gate structure has a channel formed along a sidewall of the inner wall of the trench in the semiconductor substrate when the device is on, and
    a first emission intensity of a first band edge emission of the silicon carbide in a first surface area of the inner wall of the trench is at least equal to a second emission intensity of a second band edge emission of the silicon carbide in a second surface area of a surface of the semiconductor substrate, the first emission intensity and the second emission intensity being obtained by a cathodoluminescence technique, the second surface area being free of dry etching.

2. The silicon carbide semiconductor device according to claim 1, wherein
    in a distribution of the first emission intensity of the silicon carbide in the first surface area of the inner wall of the trench, a ratio of a long-wavelength emission intensity of a long-wavelength emission to the first emission intensity of the first band edge emission is less than 35 when an acceleration voltage for electrons irradiated on the inner wall of the trench during analysis by the cathodoluminescence technique is 2 kV, or at most 9 when the acceleration voltage for the electrons irradiated on the inner wall of the trench during the analysis by the cathodoluminescence method is 5 kV, or satisfies both, the distribution of the first emission intensity and the long-wavelength emission intensity being obtained by the cathodoluminescence technique, the long-wavelength emission occurring in a wavelength band that is located at a wavelength side that is longer than a wavelength of a peak of the first band edge emission, the wavelength band of the long-wavelength emission being broader than a wavelength band of the first band edge emission.

3. The silicon carbide semiconductor device according to claim 1, wherein
    a third emission intensity of a third band edge emission of the silicon carbide in a surface of the inner wall of the trench is at least equal to a fourth emission intensity of a fourth band edge emission of the silicon carbide in a surface of the semiconductor substrate that is free of dry etching, the third emission intensity and the fourth emission intensity being obtained by the cathodoluminescence technique.

4. The silicon carbide semiconductor device according to claim 1, wherein
the first and second band edge emissions of the silicon carbide are each free exciton emission observed at a wavelength around 390 nm.

5. A method of manufacturing the silicon carbide semiconductor device of claim 1, the semiconductor device having the insulated gate with the three-layered structure including the gate, the oxide film, and the semiconductor, the method, comprising:
performing dry etching and thereby forming the trench in the semiconductor substrate that has the main surface and contains silicon carbide constituting the semiconductor, the trench extending the predetermined depth from the main surface of the semiconductor substrate, in the depth direction;
performing a treatment that includes a first heat treatment performed under a gas atmosphere containing a nitric oxide gas and a second heat treatment performed successively after the first heat treatment, under a nitrogen gas atmosphere, the treatment being performed after forming the trench;
removing an oxide layer formed on an inner wall of the trench by the treatment and thereby exposing the inner wall of the trench;
forming the gate insulating film on and along the inner wall of the trench, after removing the oxide layer and exposing the inner wall of the trench, the gate insulating film constituting the oxide film;
baking the gate insulating film by a third heat treatment; and
forming the gate electrode on the gate insulating film in the trench after baking the gate insulating film and thereby forming the trench gate structure in which the channel is formed along the sidewall of the trench in the semiconductor substrate when the device is on, the gate electrode constituting the gate, wherein
performing the treatment includes:
performing the first heat treatment at a temperature in a range of 1200 degrees C. to 1350 degrees C., and
maintaining the temperature of the first heat treatment, switching to the nitrogen gas atmosphere, and performing the second heat treatment, and
a total treatment time of the first heat treatment and the second heat treatment includes a total time of at least 90 minutes when the temperature is a predetermined maximum temperature.

6. The method according to claim 5, wherein
performing the treatment includes:
performing the first heat treatment for 15 minutes to 60 minutes, and
performing the second heat treatment for 30 minutes to 75 minutes.

7. The method according to claim 5, wherein
the first heat treatment is performed under the gas atmosphere containing the nitric oxide gas at a percentage of 5% to 20% mixed with a nitrogen gas.

8. The method according to claim 5, wherein
a damaged layer is formed on the inner wall of the trench by the dry etching, the method further comprising oxidizing the damaged layer to form the oxide layer, by the first heat treatment.

9. The method according to claim 5, wherein
performing the treatment includes terminating a defect of the inner wall of the trench by nitrogen contained in the nitric oxide gas in the first heat treatment.

10. The method according to claim 5, further comprising
repairing a disturbance in a crystal structure of the silicon carbide of the semiconductor substrate by the second heat treatment.

\* \* \* \* \*